US012794454B2

(12) United States Patent
Aizawa

(10) Patent No.: US 12,794,454 B2
(45) Date of Patent: Nov. 10, 2026

(54) SEMICONDUCTOR INTEGRATED CIRCUIT AND EQUIPMENT

(71) Applicant: CANON KABUSHIKI KAISHA, Tokyo (JP)

(72) Inventor: Eiji Aizawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 8 days.

(21) Appl. No.: 19/182,780

(22) Filed: Apr. 18, 2025

(65) Prior Publication Data

US 2025/0337397 A1 Oct. 30, 2025

(30) Foreign Application Priority Data

Apr. 24, 2024 (JP) ................................ 2024-070815

(51) Int. Cl.

*H03K 3/00* (2006.01)
*H03K 3/037* (2006.01)
*H03K 17/00* (2006.01)

(52) U.S. Cl.

CPC ........... *H03K 3/037* (2013.01); *H03K 17/002* (2013.01)

(58) Field of Classification Search

CPC ........ G01R 31/3177; G01R 31/318536; G01R 31/318555; G01R 31/318544; G01R 31/318541; G01R 31/31723; G01R 31/318594; G01R 31/318533; G01R 31/2851; G01R 31/31716; G01R 31/317; G01R 31/318522; H03K 3/037; H03K 17/002

See application file for complete search history.

(56) References Cited

U.S. PATENT DOCUMENTS

| | | | | |
|---|---|---|---|---|
| 9,791,510 B2 * | 10/2017 | Goel | .............. | G01R 31/318541 |
| 10,156,607 B2 * | 12/2018 | Goel | .............. | G01R 31/318536 |
| 2006/0282727 A1 | 12/2006 | Hoshaku | | |
| 2016/0003902 A1 * | 1/2016 | Maliuk | ............ | G01R 31/31723 714/727 |
| 2017/0307683 A1 * | 10/2017 | Goel | .............. | G01R 31/318536 |
| 2018/0341724 A1 | 11/2018 | Sugahara | | |

FOREIGN PATENT DOCUMENTS

| | | |
|---|---|---|
| JP | H06160480 A | 6/1994 |
| JP | 2004030166 A | 1/2004 |
| JP | 2005032102 A | 2/2005 |
| JP | 2005257469 A | 9/2005 |
| JP | 2018197969 A | 12/2018 |

* cited by examiner

*Primary Examiner* — Tuan T Lam
(74) *Attorney, Agent, or Firm* — Venable LLP

(57) ABSTRACT

A semiconductor integrated circuit in which a plurality of logic circuits are arranged. Each logic circuit comprises n data holding circuits, a scan chain to transfer scan data, and a clock line including a plurality of clock buffers. The clock signal from the clock line is supplied to the n data holding circuits. In a forward direction from a first data holding circuit in the n data holding circuits to an nth data holding circuit in the holding circuits, the clock signal with a large delay amount is supplied from the clock line to a data holding circuit on a downstream side. The scan chain transfers the scan data in a backward direction from the nth data holding circuit to the first data holding circuit. The scan data is transferred between the logic circuits via a first delay adjusting unit.

13 Claims, 6 Drawing Sheets

SEMICONDUCTOR INTEGRATED CIRCUIT AND EQUIPMENT

BACKGROUND OF THE INVENTION

Technical Field

One disclosed aspect of the embodiments relates to a semiconductor integrated circuit and equipment using the same.

Description of the Related Art

There is a method of conducting a test of a semiconductor integrated circuit by incorporating a scan chain in the semiconductor integrated circuit. An example of the semiconductor integrated circuit is an image sensor. In the image sensor, an analog-to-digital converter (ADC) configured to convert the information of each pixel into a digital signal, and a filter circuit configured to remove a high-frequency noise component are used. When the number of pixels of the image sensor increases, the scale of a logic circuit such as a filter circuit that is a test target becomes large. A technique of reducing hold time violation is disclosed in Japanese Patent Laid-Open No. 2004-30166.

When the circuit scale increases, a circuit scale for guaranteeing data hold in a scan chain used to test a circuit may increase. Also, along with the increase of the circuit scale, power consumption also increases.

SUMMARY OF THE INVENTION

One disclosed embodiment has been made in consideration of the above-described disadvantage, and it can provide a circuit configuration advantageous in suppressing an increase of a circuit scale and an increase of power consumption in a circuit that reduces occurrence of scan data hold time violation.

According to one aspect of the disclosure, there is provided a semiconductor integrated circuit in which a plurality of logic circuits are arranged. Each logic circuit comprises n data holding circuits configured to hold data, a scan chain configured to transfer scan data, and a clock line including a plurality of clock buffers configured to delay a clock signal. The clock signal in the clock line is supplied from the clock line to the n data holding circuits. In a forward direction from a first data holding circuit in the n data holding circuits to an nth data holding circuit, the clock signal with a large delay amount is supplied from the clock line to a data holding circuit on a downstream side. The scan chain is arranged to transfer the scan data in a backward direction from the nth data holding circuit to the first data holding circuit. The scan data is transferred between the logic circuits via a first delay adjusting unit.

Further features of the present invention will become apparent from the following description of exemplary embodiments with reference to the attached drawings.

DESCRIPTION OF THE EMBODIMENTS

Figure 1:
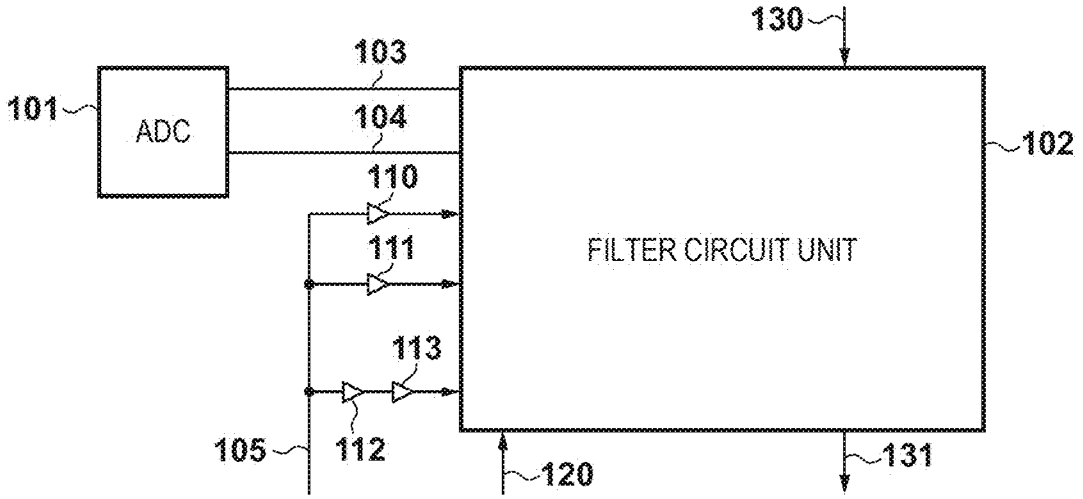
FIG. 1 is a block diagram showing an example of a semiconductor integrated circuit so as to explain the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

An example of a semiconductor integrated circuit to which the present invention is applied will be described with reference to FIG. 1. FIG. 1 shows an analog-to-digital converter (ADC) 101 and a filter circuit unit 102. In a semiconductor integrated circuit such as an image sensor, the ADCs 101 that convert analog data from the image sensor into digital data and the filter circuit units 102 are implemented in a great number. The ADC 101 outputs a clock 103 and a clock enable 104 to the filter circuit unit 102. Although only one wire is shown for the clock enable 104 here, a plurality of wires may actually be provided to transmit a multi-bit signal. A description will be made below assuming that 32 clock enables 104 corresponding to 32 bits are output from the ADC 101. As the ADC 101, a slope type A/D conversion circuit, a successive approximation type A/D conversion circuit, a delta-sigma ($\Delta\Sigma$) A/D conversion circuit, or the like is used, but the ADC 101 is not limited to these.

An example in which a scan test of a logic circuit is performed will be described below. In this embodiment, an example in which the filter circuit unit 102 that is the target of the scan test is tested will be explained. The target of the test is not limited to a filter and may be a logic circuit of another type. The scan test is performed based on a test clock 105. The test clock 105 is a clock used for the scan test of the filter circuit unit 102. The test clock 105 is branched into a plurality of clocks and input to a plurality of filter circuits arranged in the filter circuit unit 102. In this example, 32 filter circuits corresponding to the 32 output bits of the ADC 101 are arranged in the filter circuit unit 102. The test clock 105 is branched and supplied to the filter circuits. The filter circuits arranged in accordance with the number of output bits of the ADC 101 can be referred to as one logic circuit group together. In this embodiment, one logic circuit group is formed by 32 filter circuits. The number of logic circuits forming the logic circuit group is not limited to this, and the logic circuit group can be formed by a predetermined number of logic circuits as needed. The filter circuit unit 102 according to this embodiment removes noise included in A/D-converted data, and a decimation filter or the like is also included.

Clock buffers 110 to 113 are buffers inserted between a point where the test clock 105 is input and the filter circuits arranged in the filter circuit unit 102, and they are automatically inserted by a layout tool based on constraints such as wiring lengths and signal transition times. Scan chain input 130 is scan data input to test the filter circuit unit 102. Scan chain output 131 is the output of the scan chain of the filter circuit unit 102. Note that FIG. 2 exemplarily shows the buffers 110 to 113. The buffers can be arranged in correspondence with the filters.

A test mode signal 120 is a signal for switching the filter circuit unit 102 to a test mode. When the test mode signal is at L level ("0"), the filter circuit unit 102 operates as a normal filter. When the test mode signal is at H level ("1"), the filter circuit unit 102 is controlled to the scan test mode. Note that the relationship between H level and L level may be reversed.

Figure 2:
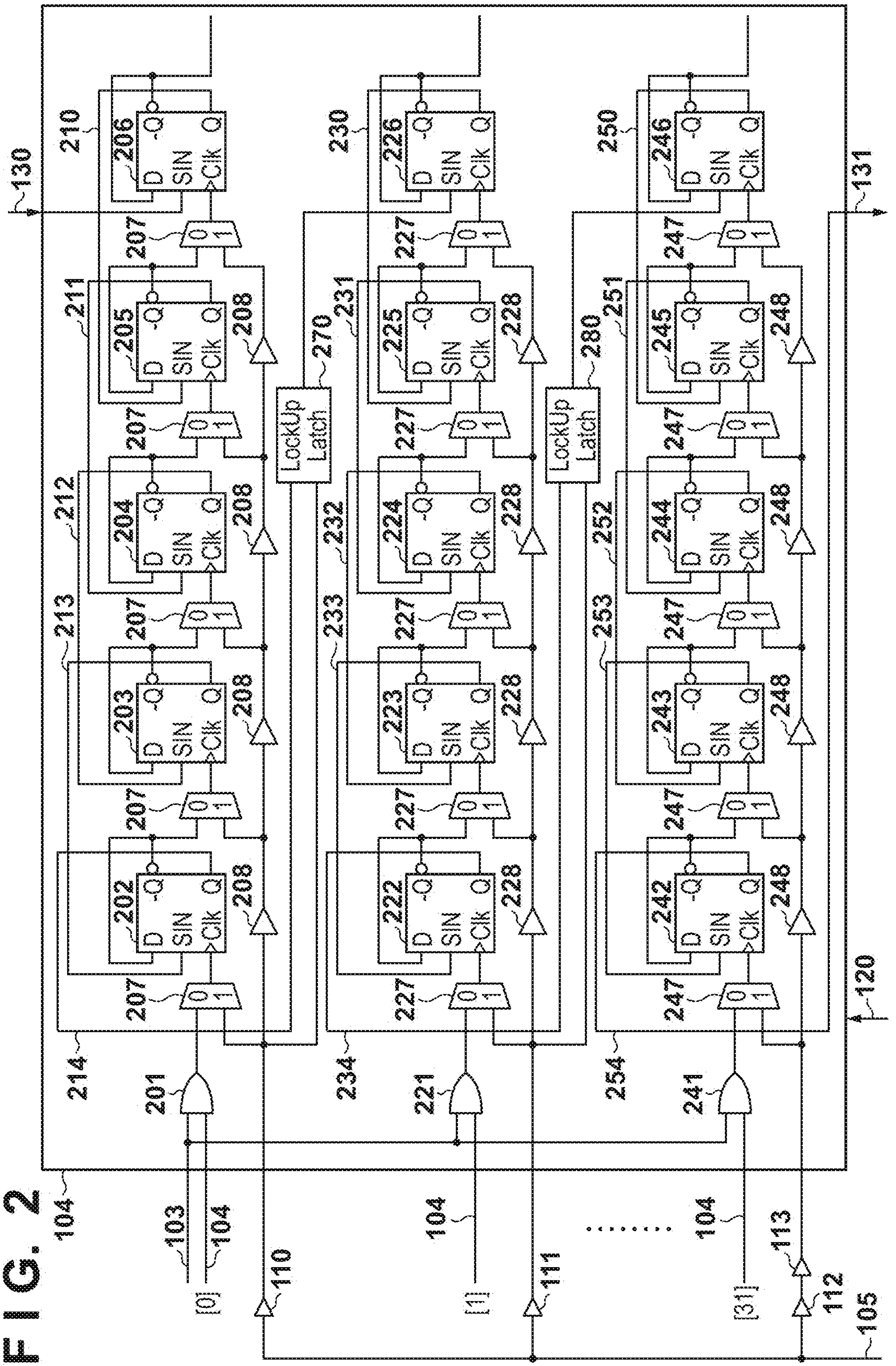
FIG. 2 is a circuit diagram showing an example of the configuration of a filter circuit according to the first embodiment.

FIG. 2 shows an example of the circuit configuration of the filter circuit unit 102. An AND gate 201 is a circuit that outputs the logical AND of the clock 103 and the clock enable 104 from the ADC. The AND gate 201 supplies the logical AND, via a clock switching circuit 207, to a clock input Clk of a flip-flop 202 that operates as a data holding circuit. Similarly, AND gates 221 and 241 respectively supply the logical AND, via clock switching circuits 227 and 247, to the clock inputs Clk of flip-flops 222 and 242.

In this embodiment, the clock enable 104 input to the filter circuit unit 102 includes 32 bits from [0] to [31]. In the filter circuit unit 102, 32 sets of logic circuits each including five flip-flops as one set are arranged. A logic circuit group is formed by the 32 sets of logic circuits. Note that FIG. 2 shows three sets of logic circuits among the 32 sets. In this embodiment, an example in which one logic circuit includes five flip-flops will be described. However, the number of flip-flops is not limited to this. There may be arranged n flip-flops which can sequentially transfer data from the first flip-flop to which the output of the AND gate is input first to the nth flip-flop. Each logic circuit can form a part of a filter. Note that, for circuits that perform a similar operation, a description of the operation may be omitted hereinafter.

The clock switching circuits 207, 227, and 247 are circuits that switch between the ANDs of the AND gates 201, 221, and 241 and the test clock (105) depending on the value (L level ("0") or H level ("1")) of the test mode signal 120. A multiplexer may be used as the clock switching circuit.

In this embodiment, the clock switching circuits 207, 227, and 247 can each select the test clock 105 when the test mode signal 120 is at H level ("1"). Also, when the test mode signal 120 is at L level ("0"), the clock switching circuits 207, 227, and 247 can each select the clock 103 output by the AND of the AND gates 201, 221, and 241.

The configuration of each flip-flop will be described using the flip-flop 202 as an example. The flip-flop 202 includes the clock input Clk, a data input D, a signal input SIN, an inverted output-Q, and a positive output Q. The flip-flop 202 performs different operations when operating normally and when performing a scan test. Operation switching is done based on the test mode signal 120. The test mode signal 120 can control the operation of the flip-flop 202 via a wire (not shown).

In this embodiment, when the clock switching circuits 207, 227, and 247 each select the output of the AND gate, the first flip-flop 202 receives inverted data of a value held by itself in synchronism with the selected clock. A second flip-flop 203 receives inverted data of a value held by itself in synchronism with the output of the first flip-flop 202. The flip-flops 202 to 206, the flip-flops 222 to 226, and the flip-flops 242 to 246 each operate as a ripple counter that forms a part of a filter.

When each of the flip-flops 202 to 205 operates as a ripple counter, the test mode signal 120 controls the flip-flop such that the data input D receives the inverted output-Q in synchronism with the clock to the clock input Clk. The inverted output-Q of the flip-flop 202 is received by the data input D in synchronism with the clock Clk. The inverted output-Q from the flip-flop 202 is input to the clock Clk of the flip-flop 203 by the clock switching circuit 207. The inverted output-Q of the flip-flop 203 is input to the clock input Clk of the flip-flop 204. Thus, the data can sequentially be transferred from the flip-flop 202 to the flip-flop 206. The flip-flops 202 to 205 can thus operate as a ripple counter.

Also, when performing a scan test, by the test mode signal 120, each flip-flop is controlled such that the test clock is supplied as a clock to the flip-flop. At the time of the scan test, the flip-flop is controlled such that the positive output Q is received by the signal input SIN in synchronism with the test clock.

Clock buffers 208 are buffers inserted to increase a delay amount when a clock propagates from the flip-flop 202 to the flip-flop 206 in the flip-flop connection order. The number of clock buffers 208 and the arrangement of these are instructed at the time of design of the semiconductor integrated circuit to guarantee the setup time of the flip-flops. The clock buffers 208 form a clock line for supplying a clock to the flip-flops 202 to 206 arranged in correspondence with the clock buffers.

Clock buffers 228 are buffers arranged to increase a delay amount when a clock propagates from the flip-flop 222 to the flip-flop 226, as described above. Also, similarly, clock buffers 248 are buffers arranged to increase a delay amount when a clock propagates from the flip-flop 242 to the flip-flop 246.

Scan chains 210 to 214 are scan chains configured to transfer scan data to the flip-flops 202 to 206. The scan chains 210 to 214 connect the flip-flops such that scan data can be transferred in the backward direction reverse to the forward direction in which the clock buffers 208 propagate the clock while delaying it. If the order of supplying a clock signal from the clock line to each flip-flop is defined as the forward direction, a clock with a large delay amount is supplied from the clock line to a flip-flop on the downstream side in the forward direction. In addition, the scan chains are arranged to transfer scan data from a flip-flop to which a clock with the largest delay amount is supplied to a flip-flop to which a clock with the smallest delay amount is supplied. That is, the scan chains are arranged such that the scan data is transferred in the backward direction from a flip-flop on the downstream side to a flip-flop on the upstream side. Note that an example in which five flip-flops including the first flip-flop 202 to the fifth flip-flop 206 are arranged has been described here. However, the number of flip-flops is not limited to this.

Scan data from the positive output Q of the flip-flop 206 is transferred to the signal input SIN of the flip-flop 205 via the scan chain 210. Scan data from the positive output Q of the flip-flop 205 is transferred to the signal input SIN of the flip-flop 204 via the scan chain 211. The scan chains are connected such that the scan data is transferred in a direction reverse to the clock propagation direction. This can reduce occurrence of hold time violation when the flip-flops 202 to 206 receive scan data.

Similarly, scan chains 230 to 234 and scan chains 250 to 254 are scan chains configured to transfer scan data between the flip-flops 226 to 222 and the flip-flops 246 to 242. The scan chains 230 to 234 and the scan chains 250 to 254 can transfer scan data in the backward direction reverse to the forward direction in which the clock buffer 228 and the clock buffer 248 propagate the clock while delaying it.

Scan data transfer between the logic circuits will be described next. As shown in FIG. 2, the test clock supplied to the flip-flop 206 is delayed relative to the test clock supplied to the flip-flop 202. Also, the test clock supplied to the flip-flop 226 can also be delayed relative to the test clock supplied to the flip-flop 202. Hence, the clock delay is not adjusted between the flip-flop 202 and the flip-flop 226. Since scan data transferred from the positive output Q of the flip-flop 202 to the signal input SIN of the flip-flop 226 is synchronized with the test clocks of different timings, hold time violation may occur. Between the flip-flop 222 and the flip-flop 246 as well, hold time violation may occur at the time of data transfer.

To eliminate the hold time violation between the logic circuits, a buffer configured to adjust the delay time can be arranged. However, power consumption may increase due to the addition of the buffer. In this embodiment, a lockup latch 270 is arranged in the transfer path of scan data between the logic circuits. The lockup latch 270 can delay data from the flip-flop 202 by a half period of the test clock 105. By the lockup latch 270, the signal of the scan chain 214 can be output while being delayed by the half period of the test clock 105. When the lockup latch 270 is inserted to the scan chain 214, occurrence of hold time violation between the flip-flop 202 and the flip-flop 226 can be reduced.

Similarly, a lockup latch 280 is inserted to the scan chain 234, thereby reducing occurrence of hold time violation between the flip-flop 222 and the flip-flop 246. With the above-described circuit configuration, it is possible to reduce occurrence of hold time violation at the time of scan data transfer between the logic circuits without inserting a buffer to the scan chain.

Figure 3A:
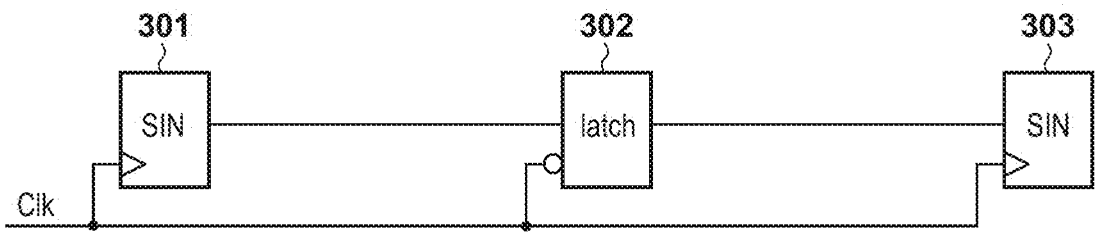
FIGS. 3A and 3B are circuit diagrams showing an example of a delay adjusting unit according to the first embodiment.

The operation of the lockup latch will be described next with reference to FIG. 3A. A flip-flop 301 and a flip-flop 303 are flip-flops that operate in synchronism with the leading edge of the clock Clk. A latch circuit 302 is arranged between the flip-flop 301 and the flip-flop 303. Since the latch circuit 302 latches data in synchronism with the inverted clock of the clock Clk, the data from the flip-flop 301 to the flip-flop 303 is delayed by the half period of the clock Clk and transferred.

Figure 3B:
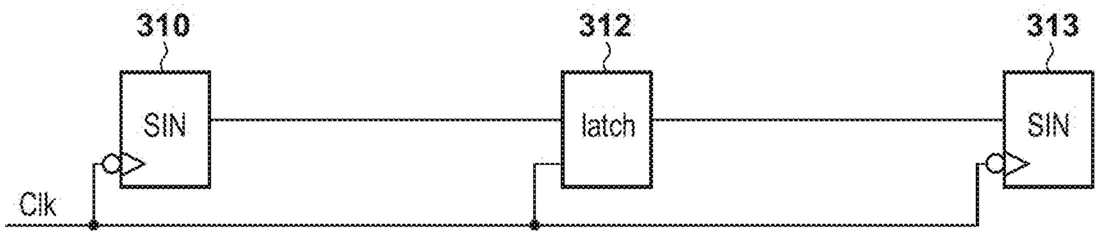

FIG. 3B shows an example in which flip-flops that operate in synchronism with the trailing edge of the clock Clk are used as a flip-flop 310 and a flip-flop 313. At this time, a latch circuit 312 arranged between the flip-flop 310 and the flip-flop 313 latches data in synchronism with the leading edge of the clock Clk. In this example as well, the flip-flops 310 and 313 and the latch circuit 312 use the inverted clock, thereby delaying the data transferred from the flip-flop 310 to the flip-flop 313 by the half period of the clock Clk.

By the lockup latch 270, data can be delayed by the half period of the clock at the time of data transfer from the flip-flop 202 to the flip-flop 226. Occurrence of hold time violation can thus be reduced when transferring scan data between the logic circuits via the scan chain.

Figure 4:
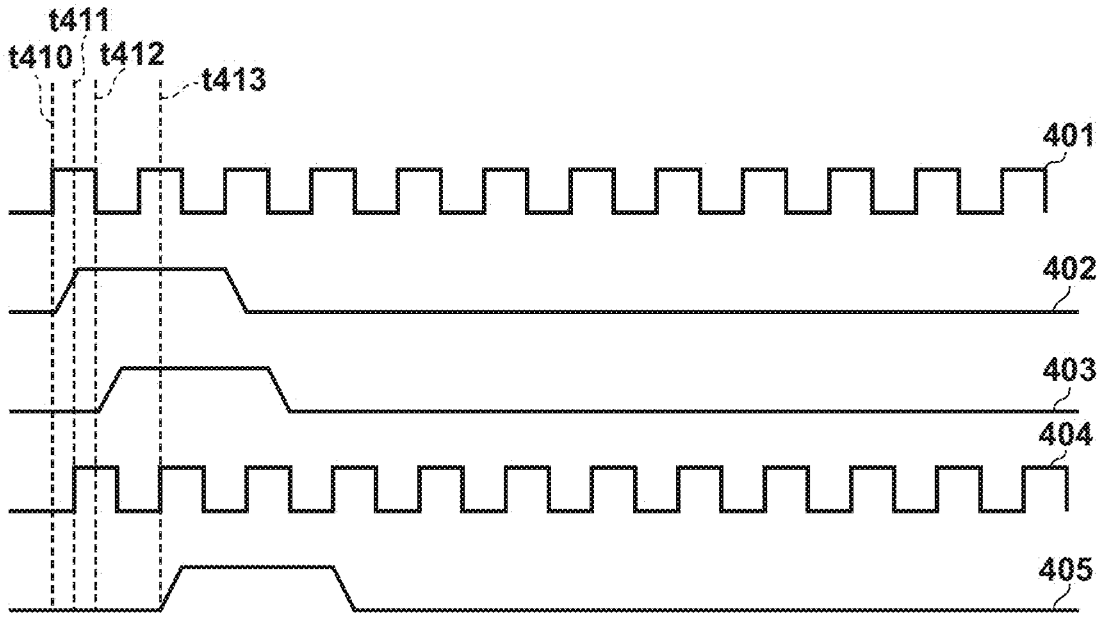
FIG. 4 is a timing chart according to the first embodiment.

Reduction of hold time violation by the lockup latch will be described with reference to the timing chart of FIG. 4. FIG. 4 shows a case where the test mode signal is at H level. A topmost rectangular wave indicates a test clock 401 supplied to the flip-flop 202. In FIG. 4, time passes toward the right. A second trapezoidal wave from the top indicates scan data 402 that is the input to the lockup latch 270 and is transferred on the scan chain 214. Here, the scan data 402 starts transiting to H level as the test clock 401 rises at timing t410.

A third trapezoidal wave from the top indicates scan data 403 output from the lockup latch 270. A fourth rectangular wave from the top indicates a test clock 404 input to the flip-flop 226 via the clock buffer 228. A lowest waveform indicates scan data 405 on the scan chain 230, which is the output of the flip-flop 226.

Timing t411 is on the right side of timing t410, and this indicates that the input clock of the flip-flop 226 rises at timing later than the input clock of the flip-flop 202, due to the influence of clock propagation delay.

When the test clock 401 rises at timing t410, scan data 402 starts transiting to H level on the scan chain 214. After timing t411, the scan data 402 changes to H level.

A case where the lockup latch 270 does not exist will be described first. In this case, at timing t411, the rise timing of the test clock 404 of the flip-flop 226 and the timing of transition of the signal of the scan data 402 may overlap. For this reason, hold time violation may occur, and the value of the scan data 402 may erroneously be received.

A case where the lockup latch 270 exists will be described. In this case, until the test clock 401 falls at timing t412, the value of the scan data 403 output from the lockup latch 270 remains L level. For this reason, the possibility that hold time violation occurs in the flip-flop 226 is low. Also, since the scan data 403 starts transiting to H level from timing t412, the flip-flop 226 can receive the value of the scan data 403 at timing t413. When the data is delayed by a half clock cycle using the lockup latch 270, a data reception error, that is, occurrence of hold time violation can be reduced.

As described above, when transferring scan data from the flip-flop of the logic circuit at the preceding stage to the flip-flop of the logic circuit at the subsequent stage, occurrence of errors can be reduced even if the clock has a delay difference between the flip-flop at the preceding stage and the flip-flop at the subsequent stage.

Note that FIG. 4 shows a timing chart associated with the scan chain 214 and the lockup latch 270, and the lockup latch 280 can operate at a similar timing. In the example shown in FIG. 2, only three sets of logic circuits each formed by five flip-flops are shown. Other logic circuits (not shown) can also similarly be operated by arranging lockup latches therebetween.

In addition, a low frequency is used as the frequency of the test clock used when shifting data after the scan test. Hence, the necessity of taking setup time violation upon shifting scan data into consideration is low. Also, when a lockup latch is inserted to impart signal propagation delay of a half period of the clock to scan data, as in this embodiment, hold time violation of scan data between clocks for which clock delay adjustment is not performed can be prevented, and transmission/reception of test data is possible.

Figure 5:
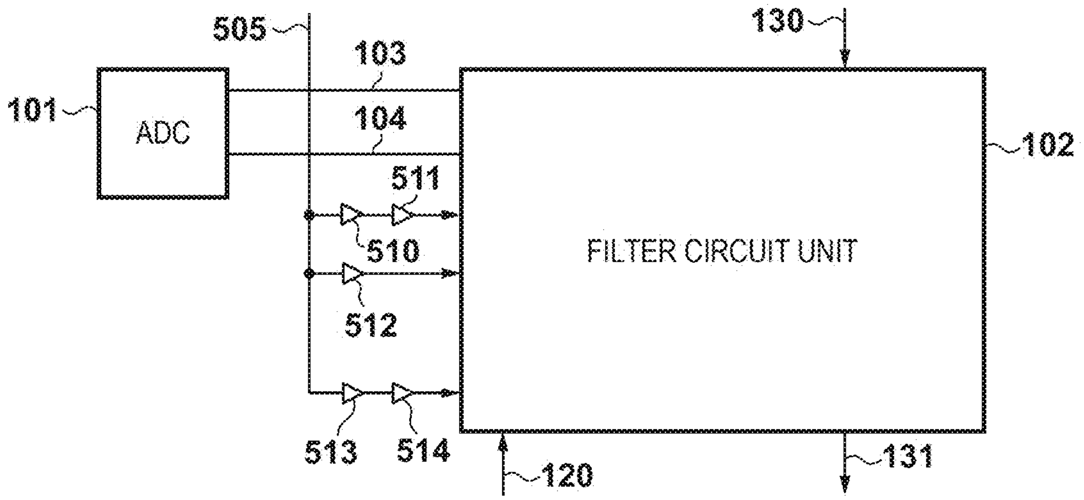
FIG. 5 is a block diagram showing a modification of the semiconductor integrated circuit according to the first embodiment.

FIG. 5 shows an example of arrangement different from FIG. 1. Here, the physical position of the test clock 105 is changed. Also, if the physical arrangement of the filter circuit unit 102 on the semiconductor integrated circuit is changed, the relative position between the test clock and the filter circuit may change.

In FIG. 5, a test clock 505 is supplied from a position different from FIG. 1 to the filter circuit unit 102. Like FIG. 1, the test clock 505 can be branched into a plurality of clocks in correspondence with the plurality of filters arranged in the filter circuit unit 102 and supplied. Note that the number of branches of the test clock 505 is 32, like the case shown in FIG. 1.

The branched test clocks are input to the filter circuit unit 102 via clock buffers 510 to 514. In this example, the clock buffers 510 to 514 inserted to the test clock 505 are exemplarily shown. More clock buffers may be arranged in correspondence with the number of branches. The clock buffers are designed and inserted by a layout tool based on constraint conditions such as wiring lengths and signal transition times.

In the example shown in FIG. 5, since the physical arrangement and position of the test clock 505 are different from the example shown in FIG. 1, the insertion state of the clock buffers 510 to 514 and the insertion state of the clock buffers 110 to 113 are different. Hence, the delay time of the 32 test clocks 505 input to the filter circuit unit 102 is not the same as in the state shown in FIG. 1. However, when the circuit configuration shown in FIG. 2 is employed, even in the case shown in FIG. 5, occurrence of hold time violation at the time of scan data transfer of the flip-flops 206 to 202 can be reduced without changing the internal structure of the filter circuit unit 102.

Similarly, hold time violation can be reduced in scan data transfer on the scan chains of the flip-flops 226 to 222 and the flip-flops 246 to 242. In addition, even if the insertion state of the clock buffers 510 to 514 is different from the clock buffers 110 to 113, the difference of clock propagation delay between the flip-flops 202 to 206 and the flip-flops 222 to 226 can be absorbed by the lockup latch 270. Since the difference of clock propagation delay between the flip-flops 222 to 226 and the flip-flops 242 to 246 can also be absorbed by the lockup latch 280, hold time violation can be reduced in transmission/reception of scan data. When the implementation method of the filter circuit unit 102 shown in FIG. 2 is used, scan data can be transmitted/received without changing the interior of the filter circuit unit 102 even if the clock state outside the filter changes.

As described above, even if the state of the test clock input to the filter circuit unit 102 changes, hold can be guaranteed without modifying the internal circuit configuration of the filter circuit unit 102. Also, since the buffer configured to guarantee hold is not inserted to the scan chain between the ripple counters, power consumption can be reduced.

Second Embodiment

An example in which the filter circuit according to the present invention is applied to image sensors with different numbers of pixels will be described with reference to FIG. 6. The same reference numerals as in the first embodiment denote equivalent circuits and components in FIG. 6.

In this embodiment, an example will be described in which a switching circuit that switches the configuration of a scan chain is further added to the filter circuit unit 102 used in the first embodiment, thereby arranging a plurality of filter circuit units 102 in correspondence with image sensors with different number of pixels and reusing these.

Figure 6:
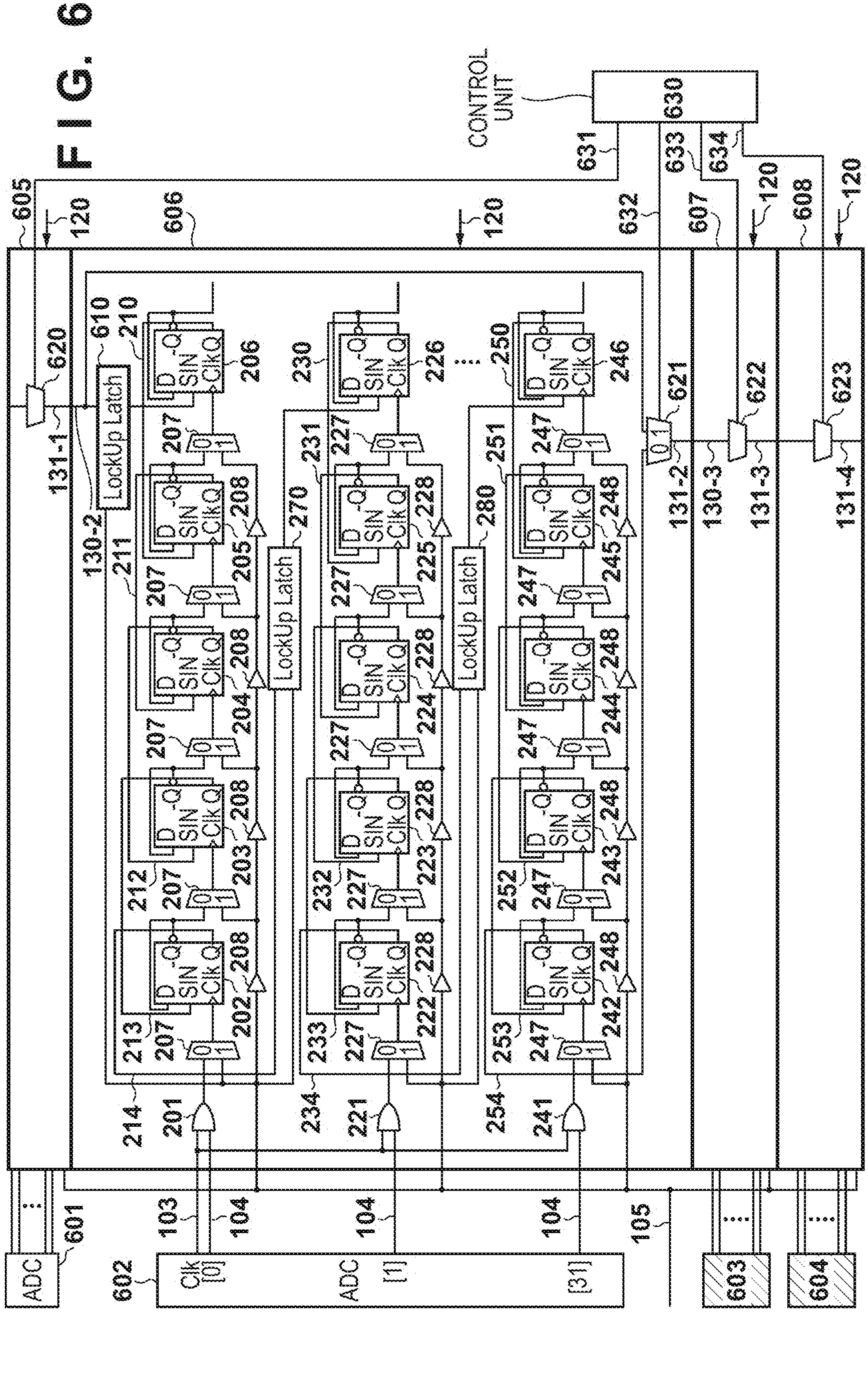
FIG. 6 is a circuit diagram showing an example of the configuration of a filter circuit according to the second embodiment.

ADCs 601 and 602 shown in FIG. 6 are ADCs that are provided at the preceding stage of the filter circuit unit 102 and used for analog-to-digital conversion (A/D conversion) processing. Dummy circuits 603 and 604 may each be a circuit that outputs a fixed value as an input signal to a filter circuit. The dummy circuits 603 and 604 may each be a circuit that does not output useful data. Note that the number of ADCs 601 and 602 and the number of dummy circuits 603 and 604 shown in FIG. 6 are merely examples, and they are not limited to this embodiment.

A filter circuit unit 605 includes a plurality of filter circuits provided in correspondence with the ADC 601. The filter circuit unit 605 corresponds to the above-described logic circuit group. Similarly, the filter circuit unit 606 is a filter circuit unit including filter circuits provided in correspondence with the ADC 602. Filter circuit units 607 and 608 are circuits implemented to reuse the filter unit. As shown in FIG. 6, in this example, for the filter circuit unit 607, a corresponding ADC does not exist due to the numbers of pixels of the image sensors. For this reason, the filter circuit unit 607 is connected to the dummy circuit 603. Similarly, the filter circuit unit 608 is also a circuit implemented to reuse the filter unit. Since no corresponding ADC exists, the filter circuit unit 608 is connected to the dummy circuit 604. In this example, two (filter circuit units 605 and 606) among the four filter circuit units 605 to 609 are used to process data from the ADCs, and the remaining two (filter circuit units 607 and 608) are not used. The filter circuits can be used for general-purpose application to image sensors with different numbers of pixels.

The filter circuit units 605 to 608 have the same internal configuration such that other image sensors can reuse the filters. Here, a description will be made using the filter circuit unit 606 as an example. A lock-up latch 610 functions as a delay adjusting unit configured to delay the signal of a scan chain input 130-2 input from the adjacent filter circuit unit 605 by the half period of a test clock 105. The output data of the lockup latch 610 is received by a flip-flop 206 of the filter circuit unit 606.

The lockup latch 610 gives a delay corresponding to the half period of the test clock to scan data. For the scan data input from the scan chain input 130-2, occurrence of hold time violation can be reduced without arranging a buffer circuit configured to adjust the delay time between the filter circuit unit 605 and the filter circuit unit 606.

A control unit 630 is a circuit that outputs control signals 631 to 634 for a scan signal switching circuit to be described later. A scan signal switching circuit 621 can switch between the scan chain input 130-2 input from the filter circuit unit 605 and scan data transferred from a flip-flop 242 via a scan chain 254. If the scan signal switching circuit 621 selects a scan chain output 131-1 input from the adjacent filter circuit unit 605, a bypass that bypasses the filter circuit unit 606 can be formed.

Switching by the scan signal switching circuit 621 is controlled by the control signal 632 from the control unit 630. A signal selected by the scan signal switching circuit 621 can be output as a scan chain output 131-2 from the filter circuit unit 606 to the outside and input to a scan chain input 130-3 of the adjacent filter circuit unit 607.

In the example of this embodiment, if the value of the control signal 632 is L level, the scan signal switching circuit 621 can select scan data output from the flip-flop 242. Also, if the value of the control signal 632 is H level, the scan signal switching circuit 621 can select the scan chain input 130-2 input from the adjacent filter circuit unit 605.

Figure 7:
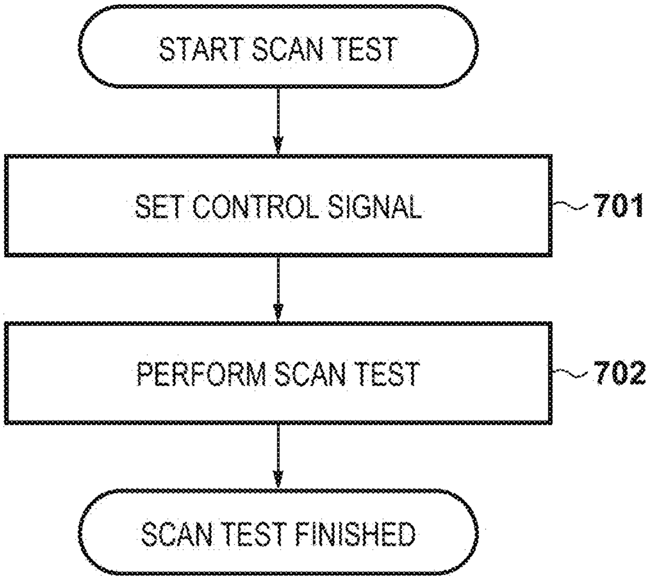
FIG. 7 is a flowchart for explaining a test according to the second embodiment.

An example of the configuration according to this embodiment will be described with reference to FIG. 7. In this embodiment, the scan test for the filter circuit unit 605 and the filter circuit unit 606 is performed. FIG. 7 is a flowchart concerning scan data transmission/reception between the filter units. In a control signal setting step 701, the value of the control signal 631 output from the control unit 630 is set to L level, the value of the control signal 632 is set to L level, the value of the control signal 633 is set to H level, and the value of the control signal 634 is set to H level.

Next, in a step 702 of executing a scan test, after a test mode signal 120 is set to H level, a predetermined number of test clocks 105 are transmitted to set scan data. Driven by the test clock 105, scan data for test is transferred via a scan chain. Thus, scan data is set for the filter circuit units 605 and 606 that require a scan test. For the filter circuit units 607 and 608 that do not require a scan test, scan data can be bypassed.

According to this embodiment, a semiconductor integrated circuit including an appropriate number of filter circuit units is prepared, and a filter circuit unit to be actually operated is selected in accordance with the number of pixels of the image sensor, and unnecessary filter circuit units can be bypassed. By preparing a semiconductor integrated circuit with general-purpose filter circuit units, it is possible to reuse the filter circuit units for image sensors with different numbers of pixels.

Application of Semiconductor Integrated Circuit to Equipment

Figure 8:
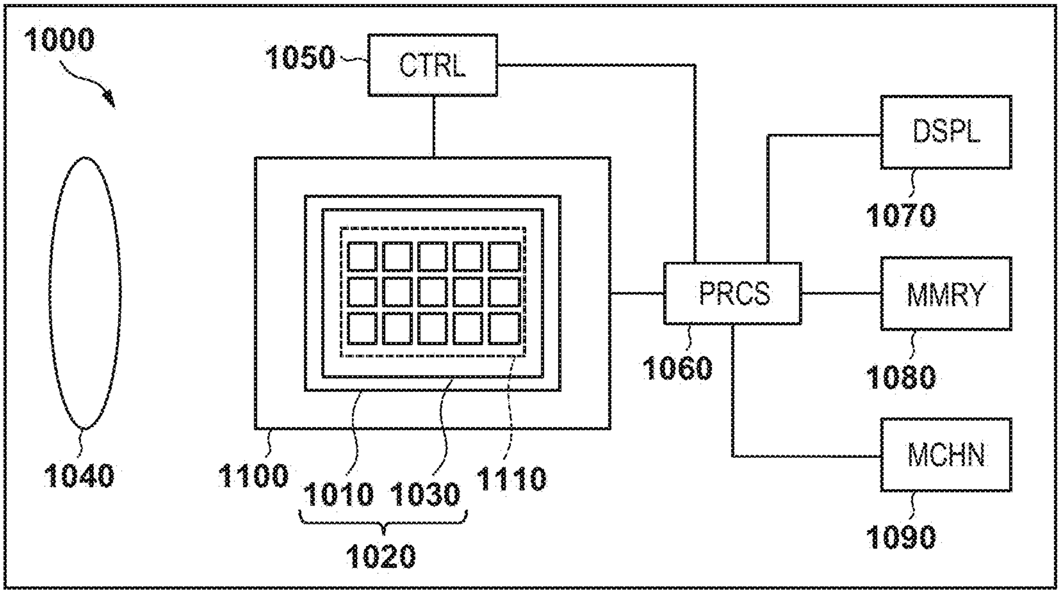
FIG. 8 is a view for explaining application of the semiconductor integrated circuit to equipment.

Equipment 1000 shown in FIG. 8, which includes a semiconductor apparatus 1100 including a package 1020 in which a semiconductor chip 1110 including a semiconductor integrated circuit is mounted, will be described below. The semiconductor chip 1110 is stored in the package 1020 and mounted in the equipment 1000. In the configuration shown in FIG. 8, the semiconductor chip 1110 includes a semiconductor integrated circuit according to the above-described embodiment. The semiconductor apparatus 1100 can include the package 1020 including a base 1010 on which the semiconductor chip 1110 is fixed, and a light transmitting member 1030 such as glass if the semiconductor chip 1110 includes an image sensor. In the package 1020, joining members such as wires and bumps, which connect inner leads provided on the base 1010 and terminals such as pad electrodes provided on the semiconductor chip 1110, can be arranged.

The equipment 1000 can include at least one of an optical apparatus 1040, a control apparatus 1050, a processing apparatus 1060, a display apparatus 1070, a storage apparatus 1080, and a machine apparatus 1090. The optical apparatus 1040 is, for example, a lens, a shutter, or a mirror. The control apparatus 1050 control the semiconductor chip 1110. The control apparatus 1050 is, for example, a semiconductor device such as an ASIC.

The processing apparatus 1060 processes an output signal from the semiconductor integrated circuit included in the semiconductor chip 1110. The processing apparatus 1060 is a semiconductor device such as a CPU or an ASIC for forming an analog front end (AFE) or a digital front end (DFE). If the semiconductor chip includes an image sensor, an image may be generated based on, for example, an event signal. The display apparatus 1070 is an electroluminescence (EL) display device or a liquid crystal display device, which displays an information image obtained by the semiconductor chip 1110. The storage apparatus 1080 is a magnetic device or a semiconductor device, which stores an information image obtained by the semiconductor chip 1110. The storage apparatus 1080 is a volatile memory such as an SRAM or a DRAM, or a nonvolatile memory such as a flash memory or a hard disk drive.

The machine apparatus 1090 includes a moving unit or a propulsion unit such as a motor or an engine. In the equipment 1000, signal output from the semiconductor chip 1110 is displayed on the display apparatus 1070 or transmitted to the outside by a communication apparatus (not shown) provided in the equipment 1000. For this purpose, the equipment 1000 may further include the storage apparatus 1080 or the processing apparatus 1060 independently of a storage circuit or an operation circuit provided in the semiconductor chip 1110. The machine apparatus 1090 may be controlled based on a signal output from the semiconductor chip 1110.

In addition, the equipment 1000 is suitable for electronic equipment such as an information terminal having an image capturing function, for example, a smartphone or a wearable terminal, or a camera, for example, a lens exchangeable camera, a compact camera, a video camera, or a monitor camera. The machine apparatus 1090 in the camera can drive components of the optical apparatus 1040 for zooming, focusing, or a shutter operation. Alternatively, the machine apparatus 1090 in the camera can move the optical apparatus 1040 for an anti-vibration operation.

Also, the equipment 1000 can be transport equipment such as a vehicle, a ship, or a flying body. The machine apparatus 1090 in the transport equipment can be used as a moving apparatus. The equipment 1000 as the transport equipment is suitable for equipment that transports the semiconductor chip 1110 or equipment that assists and/or automates drive steering by an image capturing function. The processing apparatus 1060 for assisting and/or automating drive steering can perform processing for operating the machine apparatus 1090 as a moving apparatus based on information obtained by the semiconductor chip 1110. Alternatively, the equipment 1000 may be medical equipment such as an endoscope, measuring equipment such as a distance measurement sensor, analysis equipment such as an electron microscope, office equipment such as a copying machine, or industrial equipment such as a robot.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2024-070815, filed Apr. 24, 2024, which is hereby incorporated by reference herein in its entirety.

What is claimed is:

1. A semiconductor integrated circuit in which a plurality of logic circuits are arranged, each logic circuit comprising:

n data holding circuits configured to hold data;

a scan chain configured to transfer scan data; and a clock line including a plurality of clock buffers configured to delay a clock signal, wherein the clock signal is supplied from the clock line to the n data holding circuits, in a forward direction from a first data holding circuit in the n data holding circuits to an nth data holding circuit in the n data holding circuits, the clock signal with a large delay amount is supplied from the clock line to a data holding circuit on a downstream side, the scan chain is arranged to transfer the scan data in a backward direction from the nth data holding circuit to the first data holding circuit, and the scan data is transferred between the logic circuits via a first delay adjusting unit.

2. The circuit according to claim 1, wherein the first delay adjusting unit is a latch circuit, and the latch circuit delays an input to the latch circuit by a half period of the clock signal and outputs the input.

3. The circuit according to claim 1 comprising a logic circuit group formed by a predetermined number of the logic circuits, and the semiconductor integrated circuit further comprising a switching circuit configured to control transfer of the scan data between the logic circuit groups, and a control unit configured to control the switching circuit.

4. The circuit according to claim 3, wherein the switching circuit controls whether to supply the scan data to the logic circuit group or bypass the logic circuit group.

5. The circuit according to claim 3, wherein a second delay adjusting unit configured to delay the scan data is provided between the logic circuit groups.

6. The circuit according to claim 5, wherein the second delay adjusting unit is a latch circuit, and the latch circuit delays an input by a half period of the clock signal and outputs the input.

7. The circuit according to claim 3, wherein the switching circuit includes a multiplexer.

8. The circuit according to claim 1, wherein the logic circuit operates as a ripple counter.

9. The circuit according to claim 8, wherein the ripple counter forms a part of a filter configured to decrease the number of bits of data from an analog-to-digital converter.

10. The circuit according to claim 9, wherein the analog-to-digital converter converts analog data from an image sensor into digital data.

11. The circuit according to claim 9, wherein the analog to digital converter is a delta-sigma analog to digital converter.

12. Equipment comprising:

a semiconductor integrated circuit defined in claim 1; and a processing apparatus configured to process an output signal from the semiconductor integrated circuit.

13. A semiconductor integrated circuit in which a logic circuit including n data holding circuits configured to hold data, a scan chain configured to transfer scan data, and a clock line including a plurality of clock buffers configured to delay a clock signal is arranged, wherein the n data holding circuits are connected to form a ripple counter configured to transfer data in a forward direction from a first data holding circuit to an nth data holding circuit, the clock signal is supplied from the clock line to the n data holding circuits, the clock signal with a large delay amount is supplied from the clock line to a data holding circuit on a downstream side in a forward direction, and the scan chain is arranged to transfer the scan data in a backward direction from the nth data holding circuit to the first data holding circuit.

* * * * *